United States Patent
Pascal et al.

(10) Patent No.: US 9,684,017 B2
(45) Date of Patent: Jun. 20, 2017

(54) CURRENT MEASUREMENT DEVICE AND METHOD USING A ROGOWSKI TYPE CURRENT TRANSDUCER

(71) Applicants: ABB Research Ltd., Zurich (CH); Universite de Strasbourg, Strasbourg (FR); Centre National de la Recherche Scientifique, Paris (FR)

(72) Inventors: Joris Pascal, Baden (CH); Jean-Baptiste Kammerer, Lochwiller (FR); Simon Paulus, Strasbourg (FR)

(73) Assignee: ABB Research Ltd., Zurich (CH)

( * ) Notice: Subject to any disclaimer, the term of this patent is extended or adjusted under 35 U.S.C. 154(b) by 0 days.

(21) Appl. No.: 15/088,760

(22) Filed: Apr. 1, 2016

(65) Prior Publication Data
US 2016/0320434 A1  Nov. 3, 2016

Related U.S. Application Data

(63) Continuation of application No. PCT/EP2014/069990, filed on Sep. 19, 2014.

(30) Foreign Application Priority Data

Oct. 9, 2013 (EP) .................................. 13187827

(51) Int. Cl.
  *G01R 15/18* (2006.01)
  *G01R 35/00* (2006.01)
  *G01R 19/00* (2006.01)
(52) U.S. Cl.
  CPC ....... *G01R 15/181* (2013.01); *G01R 19/0092* (2013.01); *G01R 35/005* (2013.01)
(58) Field of Classification Search
  None
  See application file for complete search history.

(56) References Cited

U.S. PATENT DOCUMENTS

| 6,191,673 B1* | 2/2001 | Ogura | ..................... H01F 27/38 336/174 |
| 2013/0128396 A1* | 5/2013 | Danesh | .................. G01R 19/00 361/45 |

(Continued)

FOREIGN PATENT DOCUMENTS

| EP | 2002767 A1 | 12/2008 |
| ES | 2102432 | 4/1992 |

OTHER PUBLICATIONS

International Search Report and Written Opinion, PCT/EP2014/069990, ABB Research Ltd., Jan. 19, 2015.

*Primary Examiner* — Jermele M Hollington
*Assistant Examiner* — Douglas X Rodriguez
(74) *Attorney, Agent, or Firm* — Taft Stettinius & Hollister

(57) ABSTRACT

A current measurement device for measuring a current through a primary conductor is provided. The current measurement device comprises a current transducer of the Rogowski type, the current transducer comprising a conductor winding connected to a pair of transducer terminals and adapted to induce there between a measurement voltage indicative of a current through the primary conductor; a pair of calibration terminals adapted for providing a calibration current to a calibration current path conforming to the primary conductor, so that the calibration current induces a calibration response voltage component between the pair of transducer terminals; and a control circuit. The control circuit comprises a calibration current generator for generating the calibration current and connected to the pair of calibration terminals for providing the calibration current via the pair of calibration terminals to the calibration current path, and a voltage analyzer connected to the pair of transducer terminals for receiving the calibration response (Continued)

voltage component induced between the pair of transducer terminals.

19 Claims, 3 Drawing Sheets

(56) References Cited

U.S. PATENT DOCUMENTS

| | | | | |
|---|---|---|---|---|
| 2013/0135111 A1* | 5/2013 | Hart | ............... | H01H 71/74 340/644 |
| 2015/0002139 A1* | 1/2015 | Lu | ............... | G01R 19/0046 324/156 |

* cited by examiner

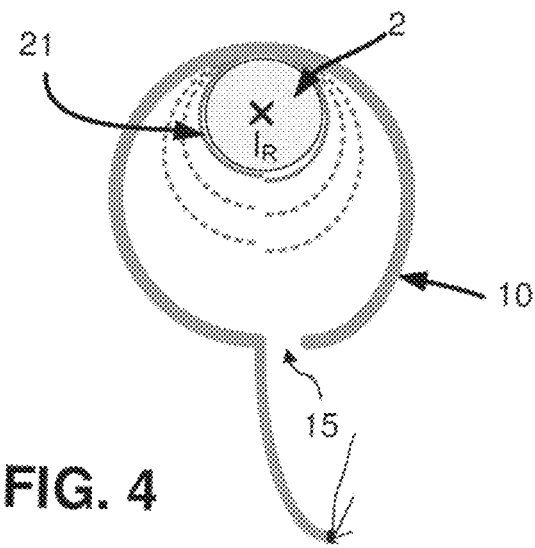
FIG. 4
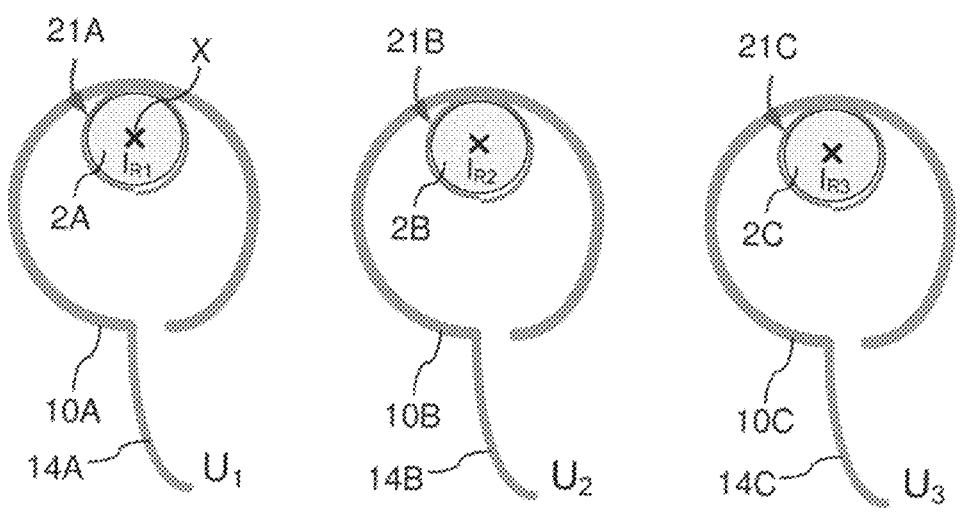
FIG. 5
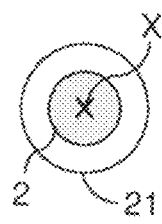 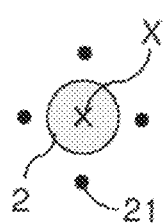 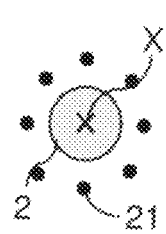
FIG. 6A  FIG. 6B  FIG. 6C

CURRENT MEASUREMENT DEVICE AND METHOD USING A ROGOWSKI TYPE CURRENT TRANSDUCER

Aspects of the invention relate to a current measurement device for measuring a current through a primary conductor. According to particular aspects, the current measurement device comprises a current transducer of the Rogowski type adapted to induce there between a measurement voltage indicative of a current through the primary conductor. Further aspects relate to a method of measuring the current through the primary conductor.

TECHNICAL BACKGROUND

In many electric applications, there is a need of measuring current that flows through a primary conductor. A very useful device for measuring such a current, especially an alternating current, in a contactless manner is a Rogowski type coil. A Rogowski coil is a coil having multiple windings around an elongated body. The elongated body is at least partially (i.e. by at least half a turn) wrapped around an axis of the primary conductor. Further, both terminals of the coil are at the same proximal end of the coil. This is achieved by a lead connecting a distal end of the coil to the corresponding terminal, the lead extending along the elongated body and through a middle of the coil. When the Rogowski coil is (fully or partially) wrapped around the axis of the primary conductor, a voltage induced between the terminals is proportional to the derivative of the current flowing through the primary conductor.

For measuring the primary conductor current with high accuracy, high-end Rogowski coils in compliance with IEC 60044-8 Class 0.2 are available. If these high-end Rogowski coils have a high winding homogeneity and are arranged precisely in relation to the primary conductor, and if high-end readout electronics are used, accurate measurements over a long period of time are possible.

However, these high-end Rogowski coils and readout electronics are costly to realise and to arrange precisely. Therefore, there is a need for a lower cost solution using more cost-effective components. More cost-effective Rogowski coils, such as flexible Rogowski coils, however, typically have poorer winding homogeneity. For this and other reasons, there has been a problem of having to calibrate these Rogowski coil periodically due to declining measurement accuracy. The calibration is necessary for diagnosing the installation and for verifying that the current measurement device is functioning and that its accuracy is sufficient.

For the purpose of calibration, the Rogowski coil is typically removed from the primary conductor and applied to test equipment generating a calibrated primary current. A similar procedure has to be applied to the readout electronics, which has to be calibrated as well. Hence, the calibration procedure generally requires the primary conductor or at least the current measurement device to be disconnected or shut down. Furthermore, these calibration procedures have only limited capability to account for drifts in measured current due to changes in the environment of the measurement apparatus, such as temperature fluctuations or fluctuations in other operating conditions.

In EP Patent Application EP 12002767, a system for performing background calibration to both a Rogowski coil and to readout electronics has been proposed. The solution involves a third conductor winding along the Rogowski coil, which is adapted to receive a calibration current signal. However, there is a need for an even more accurate calibration system that takes into account additional sources of error.

US 2004140879 discloses a non-Rogowski type current sensor based on a transformer with closed probe core and a closed compensation core, both made of magnetic material. The setup increases the dynamic measurement range of the sensor by feeding a current into the compensation winding of the setup which generates a compensating magnetic flux.

SUMMARY OF THE INVENTION

In view of the above, a current measuring device according to claim 1 and a method according to claim 14 are provided.

According to a first aspect, a current measurement device for measuring a current through a primary conductor is provided. The current measurement device comprises a current transducer of the Rogowski type, the current transducer comprising a conductor winding connected to a pair of transducer terminals and adapted to induce there between a measurement voltage indicative of a current through the primary conductor; a pair of calibration terminals adapted for providing a calibration current to a calibration current path conforming to the primary conductor, so that the calibration current induces a calibration response voltage component between the pair of transducer terminals; and a control circuit. Herein, a current path is considered as conforming to the primary conductor if the current path runs parallel, up to a tolerance of 20°, to the primary conductor and if the current path is sufficiently near the primary conductor so that a current running along the current path creates a flux—and hence induces a voltage—in the Rogowski coil that is closely related to (i.e. has a known relation, up to a tolerance of 20%,) to the flux that the same current carried by the primary conductor would induce. The control circuit comprises a calibration current generator for generating the calibration current and connected to the pair of calibration terminals for providing the calibration current via the pair of calibration terminals to the calibration current path, and a voltage analyzer connected to the pair of transducer terminals for receiving the calibration response voltage component induced between the pair of transducer terminals.

Furthermore, according to said first aspect, a method of measuring a current through a primary conductor is provided. The method comprises providing a current transducer of the Rogowski type, the current transducer comprising a conductor winding, in such relation to the primary conductor that a current through the primary conductor induce a measurement voltage at a pair of transducer terminals connected to the current transducer; providing a calibration current to a calibration current path conforming to the primary conductor, whereby the calibration current path runs parallel, up to a tolerance of 20°, to the primary conductor and whereby the calibration current path is arranged sufficiently near to the primary conductor so that a current running along the calibration current path creates a flux in the current transducer that has a known relation, up to a tolerance of 20%, to the flux that the same current carried by the primary conductor would induce; inducing, by the calibration current, a calibration response voltage component between the pair of transducer terminals; receiving the calibration response voltage component induced between the pair of transducer terminals by a voltage analyzer connected to the pair of transducer terminals; and generating an adjustment signal based on a comparison of a calibration current signal indicative of the calibration current with a calibration voltage output signal indicative of the calibration response voltage component induced by the calibration current and receiving, by the voltage analyzer connected to the calibration circuit, the adjustment signal and modifying an output signal of the voltage analyzer in dependence on the adjustment signal.

An advantage of embodiments of the invention is that the calibration can be performed on-line, without need of interrupting normal operation of the primary conductor. A further advantage of embodiments is that the calibration current runs along a calibration current path that conforms to the primary conductor. As a consequence, the calibration current induces a voltage to the Rogowski coil that resembles the voltage induced by a current along the primary conductor. Further, the calibration takes into account the geometrical arrangement of the Rogowski coil relative to the primary conductor, so that geometrically induced measurement errors can be compensated (e.g. errors due to non-perfect placement of the Rogowski coil around the primary conductor axis). Further, errors due to crosstalk and similar error sources can also be taken into account, e.g. errors due to signals emitted by neighboring phase conductors. Further, embodiments can be realized in a simple design of low complexity and using cost-effective components.

Further advantages, features, aspects and details that can be combined with embodiments described herein are evident from the dependent claims, the description and the drawings.

BRIEF DESCRIPTION OF THE FIGURES

Further details will be described in the following with reference to the Figures, wherein:

FIG. 4 is a cross-sectional view of the arrangement shown in FIG. 3 and of variations thereof;

FIG. 5 is a cross-sectional view of a current measurement device for a three-phase system; and FIGS. 6A, 6B, and 6C are cross sectional views of alternative calibration conductors suitable for embodiments of the invention.

DETAILED DESCRIPTION OF THE FIGURES AND EMBODIMENTS

Figure 1:
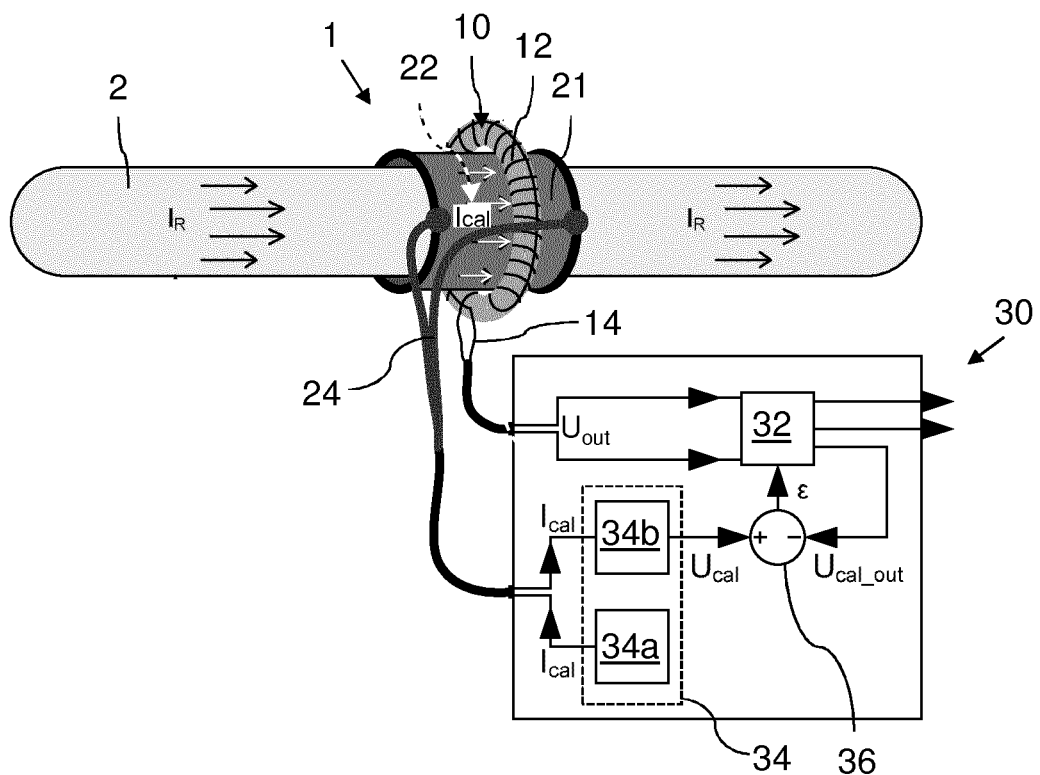
FIG. 1 is a schematic view of a primary conductor and a current measurement device according to a first aspect of the invention.

Reference will now be made in detail to the various embodiments, one or more examples of which are illustrated in each Figure. Each example is provided by way of explanation and is not meant as a limitation. For example, features illustrated or described as part of one embodiment can be used on or in conjunction with any other embodiment to yield yet a further embodiment. It is intended that the present disclosure includes such modifications and variations.

Within the following description of the drawings, the same reference numbers refer to the same or to similar components. Generally, only the differences with respect to the individual embodiments are described. Unless specified otherwise, the description of a part or aspect in one embodiment applies to a corresponding part or aspect in another embodiment as well.

Now a first embodiment will be described with reference to FIG. 1. Therein, a primary conductor 2 carries a primary current to be measured $I_R$. The Figure only shows a piece of the primary conductor 2, and the primary conductor 2 extends beyond the piece shown in FIG. 1. Further, the current measurement device 1 is provided for measuring the primary current $I_R$. For this purpose, the current measurement device 1 has a Rogowski coil (current transducer of the Rogowski type) 10. The Rogowski coil 10 is wrapped around an axis of the primary conductor 2 in such a way that the primary current $I_R$ induces a measurement voltage at the terminals 14 of the Rogowski coil 10.

Independently of the described embodiment, the Rogowski coil is typically constructed by applying an electrically conductive wire on a non-magnetic and non-conductive carrier. The carrier can be a plastic or glass or ceramic based structure and forms a closed or almost closed loop such that a kind of helical coil wire is formed. The lead from one end of the coil may return through the centre of the coil or close to centre of the coil to the other end, so that both terminals are at the same end of the coil and so that the helical coil itself does not form a closed loop.

The Rogowski coil belongs to the category of air-core coils since the carrier of the coil is non-magnetic. Its magnetic susceptibility is significantly smaller than 1. The carrier may be rigid or flexible and its shape may be a ring, torus, or other.

When placed around the primary conductor carrying an electrical current, the Rogowski coil generates a voltage proportional to the derivative of the current according to the Ampere's law. Thus, the induced voltage at the Rogowski coil terminals 14 is proportional to the derivative of the primary current $I_R$, and thereby indicative of the primary current $I_R$.

The current measurement device 1 further comprises a control circuit 30, which is adapted to receive the induced voltage from the Rogowski coil terminals 14, and to output a result signal indicating the primary current IR, as is indicated by two arrows on the right side of the control circuit 30. To this purpose, the control circuit 30 comprises a voltage analyser 32 that is connected to the pair of transducer terminals 14 for receiving the induced voltage. The voltage analyser 32 comprises an integration circuit that integrates the signal. Since the voltage induced in the Rogowski coil is proportional to the rate of change of the current in the primary conductor, the resulting integrated signal (raw output signal) is proportional to the primary current $I_R$. The integration circuit may be a digital device such as an Intelligent Electronic Device (IED), or an analog device such as a capacitor. A digital integration device has the advantage of allowing versatile further processing of the signal.

As described above, the signal from the Rogowski coil and from the voltage analyser 32—and hence the raw output signal may drift over time and therefore there is a necessity to perform a calibration from time to time. For this purpose, the control circuit 30 further comprises a calibration current generator 34. The calibration current generator 34 is connected via a pair of calibration terminals 24 to a calibration conductor 21 that provides a calibration current path 22 conforming to the primary conductor 2.

Herein, a current path is considered as conforming to the primary conductor if the current path runs parallel, up to a tolerance of 20°, to the primary conductor (i.e. its axis) and if the current path is sufficiently near the primary conductor so that a current running along the current path creates a flux—and hence induces a voltage—in the Rogowski coil that is closely related to (i.e. has a known relation, up to a tolerance of 20%, to) the flux that the same current carried by the primary conductor would induce. For example, the calibration current path may run along the primary conductor or electrically in parallel to the primary conductor.

Independently of the present embodiment, the calibration conductor 21 may be covered by an insulating layer such as a resin layer, and is thereby galvanically isolated from the primary conductor 2.

The calibration conductor 21 may be realized as a conductive foil which carries the current along an area. In this case the current path may be defined by the ensemble of currents, and the above definitions apply for the average direction of the current. Hence, the averaged current is parallel, up to a tolerance of 20°, to the primary conductor.

The outer contacts of the conductive foil, to which the calibration terminals 24 are attached, may have lower resistance than a bulk of the conductive foil 21. This can be realized by providing the outer contacts as thickened sections of the conductive foil. Thereby, an homogeneous covering of the foil surface by the calibration current $I_{cal}$ is ensured.

The calibration current generator 34 comprises a current generation module 34a and a current indicating module 34b. The current generation module 34a generates the calibration current $L_{call+}$ and applies it between the terminals 24 of the calibration conductor 21 so that the calibration current flows from one of the terminals 24 to the other. The current indicating module 34b is adapted to convert the calibration current into a calibration current signal. For example, the indicating module 34b may be provided as a resistor connecting the other one of the terminals 24 to a fixed voltage level (e.g. to ground voltage), so that the voltage $U_{cal}$ across the resistor is proportional to the calibration current and serves as the calibration current signal. In the present embodiment, $U_{cal}$ is a voltage, but it may more generally be some other signal indicative of the calibration current, e.g. a digital signal obtained from an A/D converter. Preferably, the signal indicative of the calibration current has a high accuracy, with an error of less than 20%, preferably less than 10%.

The control circuit 30 further comprises a calibration circuit 36 which is connected to the calibration current generator 34 (more precisely to the current indicating module 34b) and to the voltage analyzer 32.

For calibrating the current measurement device 1, the calibration current generator 34 (more precisely the current generation module 34a) generates the calibration current $I_{cal}$ and provides the calibration current $I_{cal}$ via the pair of calibration terminals 24 to the calibration conductor 21 such that the calibration current $I_{CAL}$ flows along the calibration current path 22. The calibration current $I_{CAL}$ induces a calibration response voltage component $U_{out}$ between the pair of transducer terminals 14 of the Rogowski coil 10. The calibration response voltage component $U_{out}$ is provided to the voltage analyser 32 via the transducer terminals 14.

The calibration response voltage component $U_{out}$ may be superimposed on other voltage components, e.g. on a measurement response voltage component due to the regular current $I_R$ along the primary conductor 2. For separating the calibration response voltage component $U_{out}$ from other voltage components, the induced current may, according to a general aspect, pass a (narrow-band-pass) frequency filter that passes only a frequency band including the frequency of the AC calibration current.

The voltage analyzer 32 then processes the calibration response voltage component $U_{out}$ in an analogous manner as for obtaining the current measurement of a current along the primary conductor 2, to form a calibration voltage output signal $U_{cal\_out}$. Namely, the voltage analyzer 32 forms a calibration voltage output signal $U_{cal\_out}$ proportional to an integral of the calibration response voltage component $U_{out}$. In the present embodiment, $U_{cal\_out}$ is provided as a voltage, but it may be provided as any other signal such as a digital signal.

Since the calibration current path 22 conforms to the primary conductor 2, the calibration response voltage component $U_{out}$ induced by the calibration current $I_{CAL}$ is closely related to the voltage that the same current carried by the primary conductor would induce, and there is a known relation (up to a certain tolerance of 20% or less) between the measured calibration response voltage component $U_{out}$ and the voltage that the same current carried by the primary conductor would induce. Therefore, the control circuit 30 is able to perform a calibration based on the known calibration current $I_{cal}$ that has been provided to the calibration current path 22, and on the calibration voltage output signal $U_{cal\_out}$. According to a general aspect of the invention, the calibration current signal $U_{cal}$ (indicative of the calibration current $I_{cal}$) and/or the calibration voltage output signal $U_{cal\_out}$ on the one hand and the measured calibration response voltage component $U_{out}$ on the other hand are used for calibrating the current measurement device.

In an alternative embodiment, the calibration voltage output signal $U_{cal\_out}$ is directly proportional to the calibration response voltage component $U_{out}$ (without integration). In this case, the calibration current signal $U_{cal}$ is proportional to a derivative of the current $I_{cal}$.

According to the embodiment of FIG. 1, the calibration is performed by the calibration circuit 36 as follows: On the one hand, the calibration circuit 36 receives from the voltage analyser 32 the calibration voltage output signal $U_{cal\_out}$. As described above, the calibration voltage output signal $U_{cal\_out}$ describes the calibration current $I_{cal}$ as measured in a manner analogous to a current measurement along the primary conductor 2. On the other hand, the calibration circuit 36 receives from the calibration current generator 34 (more precisely from the current indicating module 34b) the calibration current signal $U_{cal}$. As described above, $U_{cal}$ is a sufficiently precise indicator of the actual calibration current $I_{cal}$ applied to the calibration current path 22. Hence, the calibration circuit 36 is able to compare the current measurement signal as represented by $U_{cal\_out}$ to the actually applied current as represented by $U_{cal}$.

For calibrating, the calibration circuit 36 is configured for providing a feedback signal based on a comparison of $U_{cal\_out}$ with $U_{cal}$. Namely, the calibration circuit 36 generates an adjustment signal $\epsilon$ based on a comparison of the calibration current signal $U_{cal}$ with the calibration voltage output signal $U_{cal\_out}$, e.g. by forming the difference $$\epsilon = U_{cal\_out} - U_{cal}.$$

The calibration circuit 36 provides the adjustment signal $\epsilon$ to the voltage analyzer 32. The voltage analyzer 32 modifies the measurement output (and the output calibration voltage output signal $U_{cal\_out}$ which is obtained in the analogous manner) in dependence on the adjustment signal $\epsilon$, e.g. by adjusting an amplification prefactor of the measurement output in dependence of $\epsilon$. For example, a value proportional to ε can be subtracted from the amplification prefactor, so that the output signal and the output calibration voltage output signal $U_{cal\_out}$ are increased when ε is negative and reduced when ε is positive. As a result, a feedback loop is created that adjusts $U_{cal\_out}$ to be equal to $U_{cal}$. Other adjustments are possible as well. According to a general aspect, the voltage analyzer 32 preferably modifies the measurement output in dependence on the adjustment signal ε in such a manner that $U_{cal\_out}$ is adjusted to a value that has a known relation to $U_{cal}$.

When this final adjustment has been found, the same final adjustment is then also used for generating the calibrated measurement output representing the measured primary current $I_R$ through the primary conductor 2. Thus, a closed loop automatic gain control can be performed.

As stated above, the calibration procedure can be performed while a primary current $I_R$ is flowing through the primary conductor 2. In this case, the voltage induced in the Rogowski coil is a superposition of a measurement voltage portion induced by $I_R$ (proportional to the derivative of $I_R$) and of the calibration response voltage component $U_{out}$ induced by $I_{cal}$ (proportional to the derivative of $I_{CAL}$). For calibration, only the calibration response voltage component $U_{out}$ is extracted so that a meaningful comparison to the calibration current signal $U_{cal}$ is possible. This can be done, for example, by using different frequencies for $I_{CAL}$ and for $I_R$, and by filtering the calibration voltage output signal $U_{cal\_out}$ such that only the frequency of $I_{CAL}$ kept whereas the frequency of $I_R$ is eliminated.

According to a general aspect, the frequency of the calibration current $I_{cal}$ may be higher than the frequency of the regular current $I_R$, and in particular may be at least double or even at least five times of the frequency of $I_R$. This allows separating both signals as described above. Further, since the voltage induced in the coil (derivative of the current) is proportional to the frequency, this allows a lower calibration current while still inducing a signal of the same order of magnitude in the Rogowski coil. Hence, according to another aspect, the amplitude of the calibration current $I_{CAL}$ may be lower than the amplitude of the regular current $I_R$, e.g. lower than half of $I_R$.

By an on-line calibration as described above, the amplification can be quasi-continuously adjusted in a closed loop manner to ensure a corrected signal output. The drift of the Rogowski coil sensitivity as well as the drift of the electronics gains are continuously corrected to cancel ageing and environmental (e.g. temperature) effects of both sensor and electronics.

According to an embodiment, the magnitude of the correction prefactor calculated within modules 32 and 36 allows diagnosing the system. According to an embodiment, when a correction factor is out of the expected range corresponding to typical temperature or ageing values, e.g. outside a range of +/−20%, triggers an alarm signal indicating damage or misuse of the sensor.

According to an embodiment, the modules 32 and 36 are integrated in a single circuit board. The modules can be realized fully by analog components or partially digitally. In the case of analog components, the voltage analyzer 36 may comprise a capacitor for integrating the voltage signal. In this case the output of the voltage analyzer 36, e.g. the signal $U_{cal\_out}$, has a prefactor proportional to the frequency that needs to be taken into account.

According to an embodiment, the current indicating module 34b is switchable or replaceable by hand. In this manner, the controller 30 can be adapted in an easy manner to different Rogowski coil types, since the controller 30 can be adapted to different types of Rogowski coil characteristics while outputting a consistent current measurement signal, by only changing the signal $U_{cal}$ inputted to the calibration module. This leads to system flexibility at particularly low cost since only a single component needs to be changed.

Figure 2:
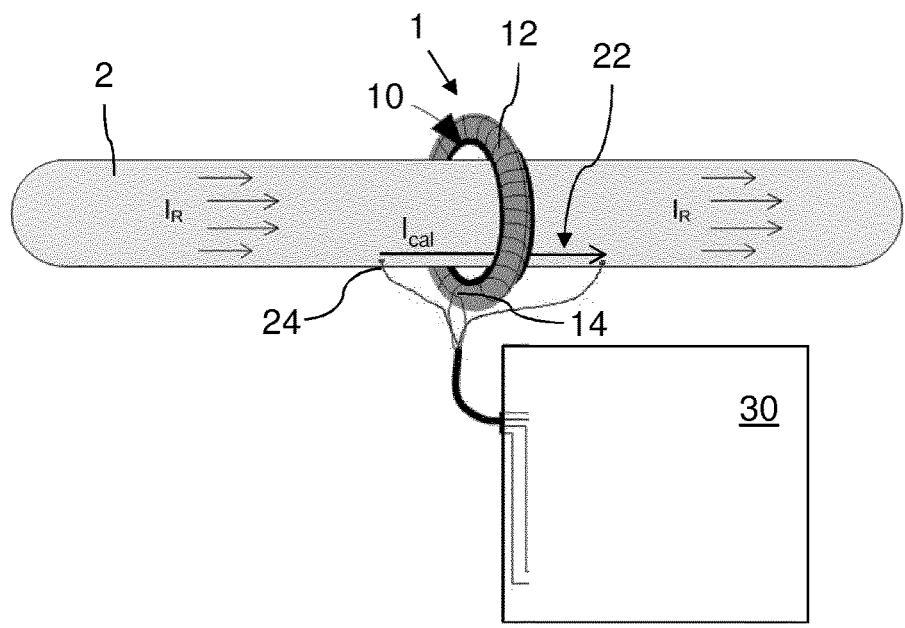
FIG. 2 is a schematic view of a primary conductor and a current measurement device according to a second embodiment of the invention.

FIG. 2 shows a current measurement device 1 according to the second embodiment. Therein, the description of FIG. 1 generally also applies, except for the differences mentioned below. Also, analogous elements are referred to by the same reference signs as in FIG. 1. Different from FIG. 1, the current measurement device 1 of FIG. 2 does not have a separate calibration conductor 21. Instead, the calibration terminals 2 of the current measurement device are directly connected to the primary conductor 2, at different axial positions of the primary conductor, such that the calibration current path 22 defined between the two calibration terminals 24 passes through a portion of the primary conductor 2, more precisely to that portion around which the Rogowski coil 10 is wrapped. In this manner, it is ensured that the calibration current path 22 is along the primary conductor 2. Details of the controller 30, which are analogous to FIG. 1, are not shown in FIG. 2.

Operation of the current measurement device of FIG. 2 is analogous to that of FIG. 1, except that the calibration current $I_{cal}$ is directly applied to the primary conductor 2. This arrangement of FIG. 2 has the advantage that the same current path is used for measuring the primary current IR along with the primary conductor and for calibration, so that geometric misalignments are reduced even further.

Figure 3:
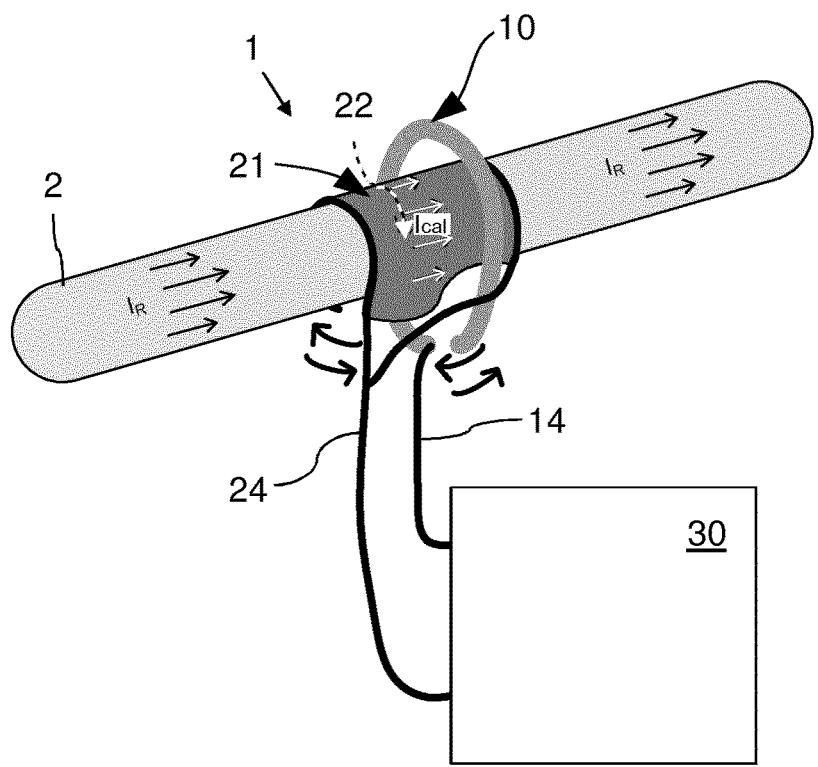
FIG. 3 is a schematic view of a primary conductor and a current measurement device according to a third embodiment of the invention.

Next, a third embodiment is described with reference to FIG. 3. This embodiment again corresponds to the embodiment of FIG. 1, except where mentioned below, and the same reference numbers refer to analogous components. Whereas in FIG. 1 the Rogowski coil 10 and the calibration conductor 21 surround the primary conductor 2 completely, FIG. 3 shows an embodiment in which the Rogowski coil 10 and the calibration conductor 21 surround the primary conductor 2 only partially with a small gap or slit at one side. With this arrangement, the calibration conductor 21 and the Rogowski coil 10 can be placed around the primary conductor 2 without dismantling the primary conductor 2 and without any other change of the apparatus. Hence, with this arrangement a temporary or retrofit current measurement device 1 can be provided without any modification of the remaining apparatus. This is possible since all terminals 14 of the Rogowski coil (see FIG. 3) emerge on only one side of the Rogowski coil 10 (left side of the Rogowski coil 10 in FIG. 4) so that it can be clamped on and wrapped around the primary conductor 2 easily.

The arrangement of FIG. 3 is particularly advantageous when a flexible conductive foil is used as the calibration conductor and/or when the Rogowski coil 10 is a clamp-on flexible coil, as shown in FIGS. 3 and 4.

The slits in the Rogowski coil 10 and in the calibration conductor 21 is so small that the Rogowski coil 10 and the calibration conductor 21 still essentially surround the primary conductor 2 axis. This is shown in more detail in FIG. 4, which is a cross-sectional view of the embodiment of FIG. 3. Therein, it can be seen that the calibration conductor 22 covers essentially the entire circumference of the primary conductor 2 around its axis. Thereby, it is made sure that the calibration conductor 22 provides a calibration current path that has an analogous influence on the Rogowski coil 10 as the current along the primary conductor 2. Therefore, it is generally preferred that any slit or gap in the calibration conductor 21 covers less than 180° and preferably less than 90° and even more preferably less than 30° around the middle axis of the primary conductor 2. Likewise, it is generally preferred that any slit or gap in the Rogowski coil 10 covers less than 90° and preferably less than 30° around the middle axis of the primary conductor 2.

Another advantage of providing the calibration conductor 21 as a flexible conductive foil is shown in FIG. 4: By adapting the width of the foil along the circumferential direction, the current measurement device can be adapted to different diameters of the primary conductor 2. This is illustrated by dashed lines in FIG. 4, the dashed lines representing alternative embodiments having a conductive foil 21 of larger width than the one of the embodiment of FIG. 4 that are adapted for primary conductor of larger diameter. Preferably, the diameter of the conductive foil is adjustable to fit different diameters of the primary conductor.

FIG. 5 shows another embodiment having three primary conductors 2a, 2b, 2c, one for each phase of a three-phase system. For each of the primary conductors 2a-2c, the current measurement device comprises a respective current transducer (Rogowski coil 10a, 10b, 10c) and calibration conductor 21a, 21b, 21c. Here, the Rogowski coils and calibration conductors are shown in accordance with the embodiment of FIGS. 3 and 4, and the respective description applies here as well. Any other embodiment described herein can be used instead as well.

According to a first embodiment, each of the Rogowski coils and calibration conductors are connected to a respective control unit functionality as described in the embodiment of FIG. 1 for performing an independent calibration. The respective control unit functionalities may be provided in a single casing and share the same power supply and/or other components.

According to a second embodiment, the respective control unit functionalities may be interconnected with each other. In particular, the calibration current signal $U_{cal\_i}$ associated to a given primary conductor influences the amplification prefactors associated to the Rogowski coils of the other primary conductors. Thereby, crosstalk between the primary conductors and the Rogowski coils can be cancelled.

According to this embodiment, cross-talk coefficients $\alpha_{itoj}$ may be determined by measuring the response of all Rogowski coils (represented by the calibration voltage output signal $U_{cal\_out\_j}$) to the currents $I_{cal\_i}$, in each of the calibration paths. The signals can be distinguished by using different frequencies for each of the calibration currents $I_{cal\_i}$. Alternatively a single calibration frequency can be chosen and the calibration current is applied sequentially to one phase at a time. Then, the voltage analyzer 32 generates a calibrated output as a linear superposition of the raw output signals associated with each of the Rogowski coils, with the coefficients of the linear superposition selected such as to cancel the crosstalk between the calibration signals.

Namely, the response of $U_{cal\_out\_j}$ to all currents $I_{CAL\_i}$ be represented as a set of 3 linear equations $$U_{cal\_out\_j} = \Sigma_i \alpha_{itoj} * I_{CAL\_i}. \quad (1)$$

By inverting these equations (1), the respective calibration currents $I_{cal\_i}$, are be obtained as a function of the measured calibration voltage output signals $U_{cal\_out\_j}$:

$$I_{CAL\_i} = \Sigma_j \beta_{jtoi} * U_{cal\_out\_out\_j}, \quad (2)$$

wherein the coefficients $\beta_{jtoi}$ are obtained by inverting the matrix $\alpha_{itoj}$. By transforming the voltage output signals obtained from the regular currents in accordance with Eq. (2), the a calibrated output is obtained in which the crosstalk is cancelled.

Thus, according to this embodiment, the voltage analyzer 32 is connected to each pair of transducer terminals 14 for receiving the calibration response voltage component $U_{out\_i}$ induced between each of the pairs of transducer terminals 14 by each of the calibration currents $I_{CAL\_j}$, and to determine therefrom a set of 3×3 adjustment coefficients $\beta_{jtoi}$.

The above description can be generalized straightforwardly to any other number N of primary conductors.

Alternative variations of embodiments are illustrated in FIGS. 6A-6C. These Figures only show the primary conductor 2 and the calibration conductor 21. All the other elements are as in any other embodiment described herein.

In the embodiment of FIG. 6A, the primary conductor 2 is completely surrounded by the calibration conductor 21 in a manner analogous to that shown in FIG. 1. The calibration conductor 21 may, for example, be provided as a flexible conductive foil or as a rigid sheet.

FIGS. 6B and 6C illustrate another embodiment, according to which the calibration conductor 21 is formed as multiple wires. The wires may be attached to an isolating flexible material such as an insulating foil (not shown). The wires then cover the foil surface in order to carry $I_{cal}$ along the foil. The calibration conductor 21 may thus be provided as a set of N wires running parallel to the primary conductor 2 and spaced at regular angles around central axis X of the primary conductor. The angle between two neighbouring wires of the calibration conductor 21 is then approximately (up to a tolerance of 20%) given as 360° divided by n.

In FIG. 6B, the calibration conductor 21 is provided as four wires which surround the primary conductor at regular angular distances, in this case of 90°. With this arrangement, it is made sure that the calibration current running along the calibration path defined by the calibration conductor 21 on the one hand and a current running along the primary conductor 2 on the other hand generate the same dipole and quadrupole fields. FIG. 6C shows an example of such an embodiment for the case N=8, that is for the case of the calibration conductor 21 being provided by 8 wires based at angles of 45° from each other about a central axis X of the primary conductor 2.

Another embodiment, not shown, has only a single wire 21 provided as the calibration conductor. This wire runs parallel to the primary conductor 2 and is spaced apart from the primary conductor 2 by preferably less than the diameter of the primary conductor 2.

The embodiments described herein can be varied in a number of ways. For example, the calibration conductor can be integrated within the Rogowski sensor casting, so that the Rogowski coil and the calibration conductor are provided as a single body. This solution allows particularly easy mounting, because the calibration conductor is permanently attached to the Rogowski coil to offer a single device.

In the following, some general aspects of the invention are described. Therein, the reference signs used in the attached Figures are used for illustration only. The aspects are independent of any specific embodiment. The aspects can be combined with any other aspect and/or with any embodiment described herein.

According to an aspect, any signal indicative of another signal may be proportional to one of the other signal, a derivative of the other signal, or an integral of the other signal. For example, the measurement voltage indicative of the primary current $I_R$ through the primary conductor 2 may be a derivative of the primary current $I_R$. Likewise, the calibration response voltage component $U_{cal\_out}$ may be a derivative of the calibration current $I_{cal}$. Likewise, the calibration voltage output signal $U_{cal\_out}$ indicative of the calibration response voltage component $U_{out}$ may be an integrated signal obtained by integrating the calibration response voltage component.

According to a further aspect, the calibration current signal $U_{cal}$ indicative of the calibration current $I_{cal}$ is a voltage or a digital signal.

According to a further aspect, the control circuit 30 is switchable between a normal mode and a calibration mode. In the calibration mode the calibration current generator 34 provides the calibration current and the voltage analyzer 32 analyzes the calibration response voltage component $U_{out}$ and produces the calibration voltage output signal $U_{cal\_out}$, and the calibration circuit 36 provides the adjustment signal $\epsilon$ based on a comparison of the calibration current signal $U_{cal}$ with the calibration voltage output signal $U_{cal\_out}$. In the normal mode the calibration current generator 34 provides no calibration current and the voltage analyzer 32 modifies an output signal of the voltage analyzer 32 in dependence on the adjustment signal $\epsilon$ received in the calibration mode.

According to a further aspect, the control circuit 30 further comprises a diagnosing unit connected to the calibration circuit 36 for receiving the adjustment signal $\epsilon$, and configured to issue a fault warning when the adjustment signal $\Sigma$ meets a predetermined fault condition. The fault condition may be that the adjustment signal $\Sigma$, or a calibration prefactor derived from the adjustment signal, exceeds a predetermined interval.

According to a further aspect, the calibration current signal $U_{cal}$ has a high accuracy defined by an error of less than 20%.

According to a further aspect, the calibration conductor 21 is connected between the pair of calibration terminals 24 for carrying the calibration current $I_{cal}$ along the calibration current path 22 parallel, up to a tolerance of 15%, to the primary conductor. The calibration conductor 21 is preferably galvanically isolated from the primary conductor 2.

According to a further aspect, the calibration conductor 21 defines multiple current paths, wherein, in a cross-sectional plane perpendicular to an axis X of the primary conductor 2 and including a portion of the current transducer 10, at least two of the current paths are placed at a mutual angle of at least 120°, preferably at least 170° about the axis X of the primary conductor 2.

According to a further aspect, the calibration conductor 21 is placed symmetrically about an axis X of the primary conductor 2, and preferably symmetrically about two mutually orthogonal symmetry planes containing the axis X of the primary conductor 2.

According to a further aspect, the calibration conductor 21 is a flexible conductive foil.

According to a further aspect, the calibration conductor 21 and the current transducer 10 each have an axial opening 15 allowing the calibration conductor 21 and the current transducer 10 to be clamped onto the primary conductor 2.

According to a further aspect, the calibration conductor 21 is mechanically attached to the current transducer 10 to form a single unit.

According to a further aspect, the current measurement device is adapted for measuring a current through a plurality of N primary conductors 2A, 2B, 2C, N≥2, wherein the current transducer 10 belongs to a plurality of N current transducers 10A, 10B, 10C of the Rogowski type, and the pair of calibration terminals 24 belongs to a plurality of N pairs of calibration terminals adapted for providing a respective calibration current to a respective calibration current path 22 conforming to a respective one of the N primary conductors 2. The calibration current generator 34 is adapted for providing respective calibration currents via the respective pairs of calibration terminals 24 to the respective calibration current paths 22. The voltage analyzer 32 is connected to each pair of transducer terminals 14 for receiving the calibration response voltage component $U_{out}$ induced between each of the pairs of transducer terminals 14 by each of the calibration currents, and to determine therefrom a set of N×N adjustment coefficients.

According to a further aspect, the calibration current generator 34 is adapted for generating the calibration current $I_{cal}$ as an AC current of a lower amperage and/or higher frequency than the rated current through the primary conductor 2.

According to a further aspect, the voltage analyzer 32 is configured for analyzing the calibration response voltage component $U_{out}$ induced by the calibration current $I_{cal}$ and for producing a calibration voltage output signal $U_{cal\_out}$ based on the analyzed calibration response voltage component $U_{out}$. For example, the calibration voltage output signal $U_{cal\_out}$ may be an amplified and/or filtered signal.

The invention claimed is:

1. Current measurement device for measuring a current through a primary conductor, the current measurement device comprising:
    a current transducer, the current transducer comprising a conductor winding connected to a pair of transducer terminals and adapted to induce there between a measurement voltage indicative of a current through the primary conductor;
    a pair of calibration terminals adapted for providing a calibration current to a calibration current path, so that the calibration current induces a calibration response voltage component between the pair of transducer terminals, wherein
    the current transducer is of the Rogowski type, and
    the calibration current path is conforming to the primary conductor by running parallel, up to a tolerance of 20°, to the primary conductor and by being arranged sufficiently near to the primary conductor so that a current running along the calibration current path creates a flux in the current transducer that has a known relation, up to a tolerance of 20%, to the flux that the same current carried by the primary conductor would induce; and in that the current measurement device further comprises
    a control circuit comprising
    a calibration current generator for generating the calibration current and connected to the pair of calibration terminals for providing the calibration current via the pair of calibration terminals to the calibration current path, and
    a voltage analyzer connected to the pair of transducer terminals for receiving the calibration response voltage component induced between the pair of transducer terminals.

2. Current measurement device according to claim 1, wherein the control circuit further comprises a calibration circuit, the calibration circuit being connected to
    the calibration current generator for receiving a calibration current signal indicative of the calibration current and to
    the voltage analyzer for receiving a calibration voltage output signal indicative of the calibration response voltage component induced between the pair of transducer terminals by the calibration current, and wherein the calibration circuit is configured for providing an adjustment signal based on a comparison of the calibration current signal with the calibration voltage output signal, and wherein the voltage analyzer is connected to the calibration circuit for receiving the adjustment signal and for modifying an output signal of the voltage analyzer in dependence on the adjustment signal.

3. Current measurement device according to claim 2, wherein the control circuit is switchable between a normal mode and a calibration mode, wherein
in the calibration mode the calibration current generator provides the calibration current and the voltage analyzer analyzes the calibration response voltage component and produces the calibration voltage output signal, and the calibration circuit provides the adjustment signal based on a comparison of the calibration current signal with the calibration voltage output signal, and
in the normal mode the calibration current generator provides no calibration current and the voltage analyzer modifies an output signal of the voltage analyzer in dependence on the adjustment signal received in the calibration mode.

4. Current measurement device according to claim 3, wherein the control circuit further comprises a diagnosing unit connected to the calibration circuit for receiving the adjustment signal and configured to issue a fault warning when the adjustment signal meets a predetermined fault condition.

5. Current measurement device according to claim 2, wherein the control circuit further comprises a diagnosing unit connected to the calibration circuit for receiving the adjustment signal, and configured to issue a fault warning when the adjustment signal meets a predetermined fault condition.

6. Current measurement device according to claim 2, wherein the calibration current signal has a high accuracy defined by an error of less than 20%.

7. Current measurement device according to claim 2, further comprising a calibration conductor connected between the pair of calibration terminals for carrying the calibration current along the calibration current path parallel, up to a tolerance of 15%, to the primary conductor, wherein the calibration conductor is galvanically isolated from the primary conductor.

8. Current measurement device according to claim 1, wherein the calibration current signal has a high accuracy defined by an error of less than 20%.

9. Current measurement device according to claim 1, further comprising a calibration conductor connected between the pair of calibration terminals for carrying the calibration current along the calibration current path parallel, up to a tolerance of 15%, to the primary conductor.

10. Current measurement device according to claim 9, wherein the calibration conductor defines multiple current paths, wherein, in a cross-sectional plane perpendicular to an axis of the primary conductor and including a portion of the current transducer, at least two of the current paths are placed at a mutual angle of at least 120° about the axis of the primary conductor.

11. Current measurement device according to claim 10, wherein the calibration conductor is placed symmetrically about an axis of the primary conductor.

12. Current measurement device according to claim 9, wherein the calibration conductor is placed symmetrically about an axis of the primary conductor.

13. Current measurement device according to claim 9, wherein the calibration conductor is a flexible conductive foil.

14. Current measurement device according to claim 9, wherein the calibration conductor and the current transducer each have an axial opening allowing the calibration conductor and the current transducer to be clamped onto the primary conductor.

15. Current measurement device according to claim 9, wherein the calibration conductor is mechanically attached to the current transducer to form a single unit.

16. Current measurement device according to claim 9, wherein the calibration conductor is preferably galvanically isolated from the primary conductor.

17. Current measurement device according to claim 1 adapted for measuring a current through a plurality of N primary conductors, N≥2, wherein the current transducer belongs to a plurality of N current transducers of the Rogowski type, and the pair of calibration terminals belongs to a plurality of N pairs of calibration terminals adapted for providing a respective calibration current to a respective calibration current path conforming to a respective one of the N primary conductors, wherein
the calibration current generator is adapted for providing respective calibration currents via the respective pairs of calibration terminals to the respective calibration current paths, and wherein
the voltage analyzer is connected to each pair of transducer terminals for receiving the calibration response voltage component induced between each of the pairs of transducer terminals by each of the calibration currents, and to determine therefrom a set of N×N adjustment coefficients.

18. Current measurement device according to claim 1, wherein the calibration current generator is adapted for generating the calibration current as an AC current of a lower amperage and/or higher frequency than the rated current through the primary conductor.

19. Method of measuring a current through a primary conductor, the method comprising:
providing a current transducer of the Rogowski type, the current transducer comprising a conductor winding, in such relation to the primary conductor that a current through the primary conductor induce a measurement voltage at a pair of transducer terminals connected to the current transducer;
providing a calibration current to a calibration current path conforming to the primary conductor, whereby the calibration current path runs parallel, up to a tolerance of 20°, to the primary conductor and whereby the calibration current path is arranged sufficiently near to the primary conductor so that a current running along the calibration current path creates a flux in the current transducer that has a known relation, up to a tolerance of 20%, to the flux that the same current carried by the primary conductor would induce;
inducing, by the calibration current, a calibration response voltage component between the pair of transducer terminals;
receiving the calibration response voltage component induced between the pair of transducer terminals by a voltage analyzer connected to the pair of transducer terminals; and
generating, by a calibration circuit, an adjustment signal based on a comparison of a calibration current signal indicative of the calibration current with a calibration voltage output signal indicative of the calibration response voltage component induced by the calibration current, and receiving, by the voltage analyzer connected to the calibration circuit, the adjustment signal and modifying an output signal of the voltage analyzer in dependence on the adjustment signal.

\* \* \* \* \*